(12) United States Patent
Peng et al.

(10) Patent No.: US 12,207,389 B2
(45) Date of Patent: Jan. 21, 2025

(54) SOCKET CONNECTOR ASSEMBLY HAVING A HEAT SINK AND A RETENTION MEMBER ENGAGING THE HEAT SINK

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Fu-Jin Peng, Kunshan (CN); Gong-Cheng Liu, Kunshan (CN); Jia Tan, Kunshan (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 237 days.

(21) Appl. No.: 17/864,409

(22) Filed: Jul. 14, 2022

(65) Prior Publication Data
US 2023/0077315 A1   Mar. 9, 2023

(30) Foreign Application Priority Data
Jul. 13, 2021 (CN) .......................... 202110788019.7

(51) Int. Cl.
*H05K 1/02* (2006.01)
*H05K 7/20* (2006.01)
(52) U.S. Cl.
CPC ......... *H05K 1/0203* (2013.01); *H05K 7/2039* (2013.01)

(58) Field of Classification Search
CPC ............ H01L 23/4093; H01L 23/4006; H01L 2023/4062; H01L 2023/405; H01L 23/40; H01L 21/4882; G06F 1/20; H05K 1/0203; H05K 1/181; H05K 7/2039; H05K 7/20418; H05K 2201/10393; H05K 7/20154; H05K 7/2049; H05K 1/0204; H05K 2201/066
USPC ......................................................... 361/710
See application file for complete search history.

(56) References Cited

U.S. PATENT DOCUMENTS

| | | | |
|---|---|---|---|
| 7,929,309 B2 * | 4/2011 | Zhao | ................... H01L 23/4093 |
| | | | 165/185 |
| 10,861,771 B2 | 12/2020 | Wu et al. | |
| 11,109,477 B2 | 8/2021 | Wu et al. | |
| 11,133,238 B2 | 9/2021 | Wu et al. | |

(Continued)

*Primary Examiner* — Mandeep S Buttar
(74) *Attorney, Agent, or Firm* — Ming Chieh Chang (57) ABSTRACT

An electrical connector assembly includes: a printed circuit board; an electrical connector seated upon the printed circuit board; an electronic package coupled to the electrical connector; a frame structure affixed to the printed circuit board; a metallic securing seat affixed to the frame structure and having plural securing posts; a heat sink positioned upon the electronic package and having plural through holes aligned with the securing posts; plural fasteners each extending through a corresponding through hole to engage a corresponding securing post and plural springs each compressed between an associated fastener and the heat sink; and a retention member mounted to a corresponding securing post for engaging the heat sink, wherein the retention member has a mounting part and a latching part pivoted to the mounting part.

3 Claims, 8 Drawing Sheets

(56) References Cited

U.S. PATENT DOCUMENTS

| | | | | |
|---|---|---|---|---|
| 2004/0037038 A1* | 2/2004 | Kun | .................... | H01L 23/4093 |
| | | | | 361/695 |
| 2004/0170001 A1* | 9/2004 | Lee | .................... | H01L 23/4093 |
| | | | | 257/E23.086 |
| 2004/0212963 A1* | 10/2004 | Unrein | ................ | H01L 23/4006 |
| | | | | 257/E23.084 |
| 2005/0126753 A1* | 6/2005 | Lee | .................... | H01L 23/4093 |
| | | | | 165/80.3 |
| 2009/0109630 A1* | 4/2009 | Lin | .................... | H01L 23/4006 |
| | | | | 361/709 |
| 2020/0058572 A1* | 2/2020 | Wu | .................... | H01L 23/4006 |
| 2020/0126889 A1* | 4/2020 | Mao | .................... | H01L 23/427 |
| 2020/0260613 A1* | 8/2020 | Winkel | ............. | H05K 7/20927 |
| 2020/0396825 A1* | 12/2020 | Wu | .................... | H01L 23/4093 |

* cited by examiner

SOCKET CONNECTOR ASSEMBLY HAVING A HEAT SINK AND A RETENTION MEMBER ENGAGING THE HEAT SINK

BACKGROUND OF THE INVENTION

Field of the Invention

The present invention relates to a CPU (central processing unit) socket connector assembly having a heat sink and a retention member for preventing an upward movement of the heat sink during tightening screws to fasten the heat sink.

Description of Related Art

U.S. Pat. No. 10,861,771 discloses a socket connector assembly having a heat sink and a retention piece for preventing an upward movement of the heat sink during tightening a nut to mount the heat sink. The retention piece is a one-piece member which may be further improved.

SUMMARY OF THE INVENTION

An electrical connector assembly comprises: a printed circuit board; an electrical connector seated upon the printed circuit board; an electronic package coupled to the electrical connector; a frame structure affixed to the printed circuit board; a metallic securing seat affixed to the frame structure and having a plurality of securing posts; a heat sink positioned upon the electronic package and having a plurality of through holes aligned with the plurality of securing posts; a plurality of fasteners each extending through a corresponding through hole to engage a corresponding securing post and a plurality of springs each compressed between an associated fastener and the heat sink; and a retention member mounted to a corresponding securing post for engaging the heat sink, wherein the retention member has a mounting part and a latching part pivoted to the mounting part.

DETAILED DESCRIPTION OF THE DRAWINGS

Referring to FIGS. 1-7, an electrical connector assembly 100 comprises: a printed circuit board (PCB) (not shown); an electrical connector 31 of a generally known structure having an insulative housing seated upon the PCB and a plurality of contacts secured to the insulative housing; a CPU or electronic package 300 coupled to the electrical connector; a frame structure including an upper plate 41 and a lower plate 42 affixed to opposite top and bottom surfaces of the PCB; a metallic securing seat 32 affixed to the frame structure and having four securing posts 33 at four corners thereof; a heat sink 10 positioned upon the electronic package 300 and having four through holes 111 aligned with the four securing posts, respectively; a plurality of fasteners 21 each extending through a corresponding through hole 111 to engage a corresponding securing post 33 and a plurality of springs 22 each compressed between an associated fastener 21 and the heat sink 10; and a retention member 50 mounted to a corresponding securing post 33 for engaging the heat sink 10. The electrical connector assembly 100 may further include a plurality of second springs 23 and limiting rings 34. The securing seat 32 has an opening 323 and a respective first notch 324 and second notch 325 at each of two diagonally opposite corners thereof. The lower plate 42 may include an upper insulative film 200. The securing seat 32 and the lower plate 42 may be secured to each other by a plurality of fixing pieces 43. Except for the retention member 50 of a two-piece construction instead of a one-piece construction, the above-mentioned components of the electrical connector assembly 100 and other components to be described later below are generally well known in this art so a detailed description thereof will be omitted.

The heat sink 10 includes a base 11 and a main body 12 extending upwardly from the base 11. The base 11 includes four corner sections each having a corresponding through hole 111 extending therethrough in a vertical direction. Each fastener 21 has an internal threaded portion for threaded engagement onto external threaded portion of the securing post 33. Each spring 22 may be a coil spring surrounding the fastener 21 and downwardly abutting against the base 11. During assembling the heat sink 10 upon the CPU 300, one fastener 21 is firstly screwed, against spring force from associated spring 22, to one securing post 33 which is located diagonal relative to the retention member 50 so that the corner section of the heat sink 10 near the retention member 50 will not tilt upward due to presence of the retention member 50.

Figure 1:
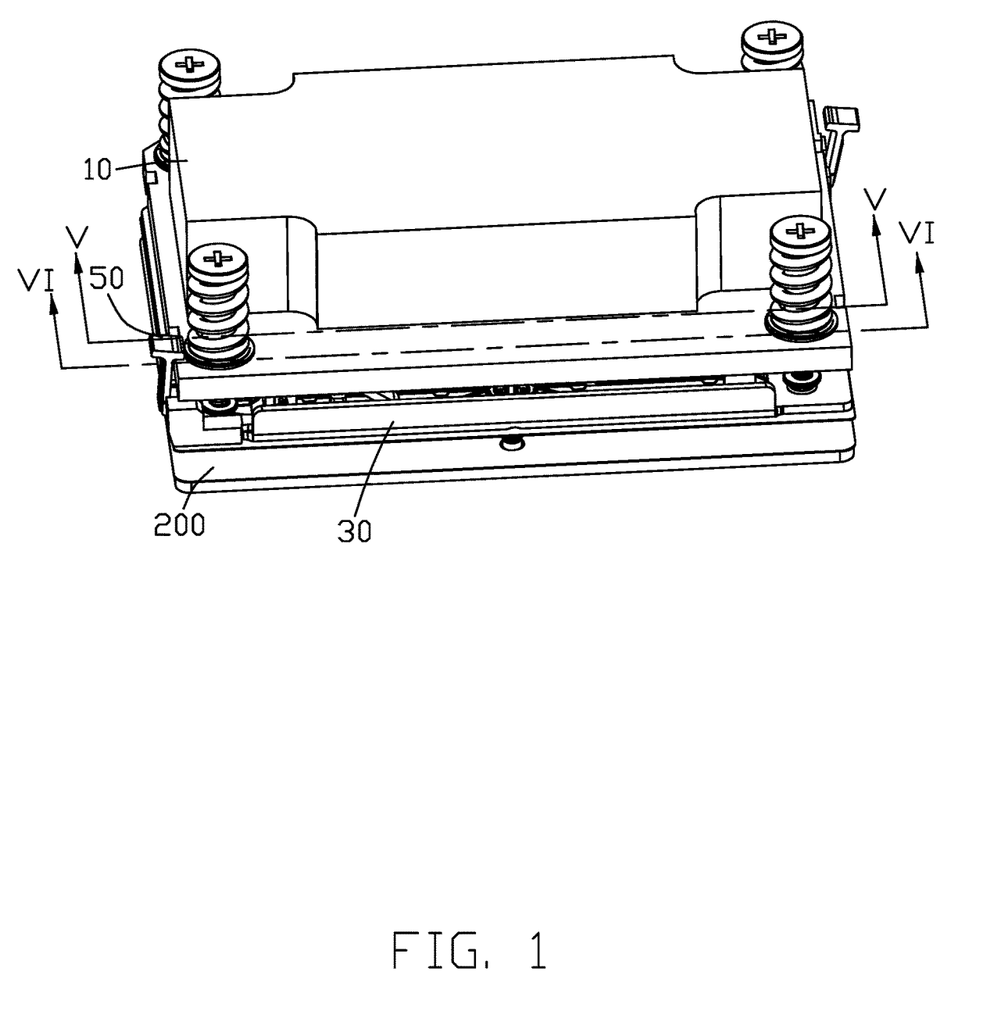
FIG. 1 is a perspective view of an electrical connector assembly.
Figure 2:
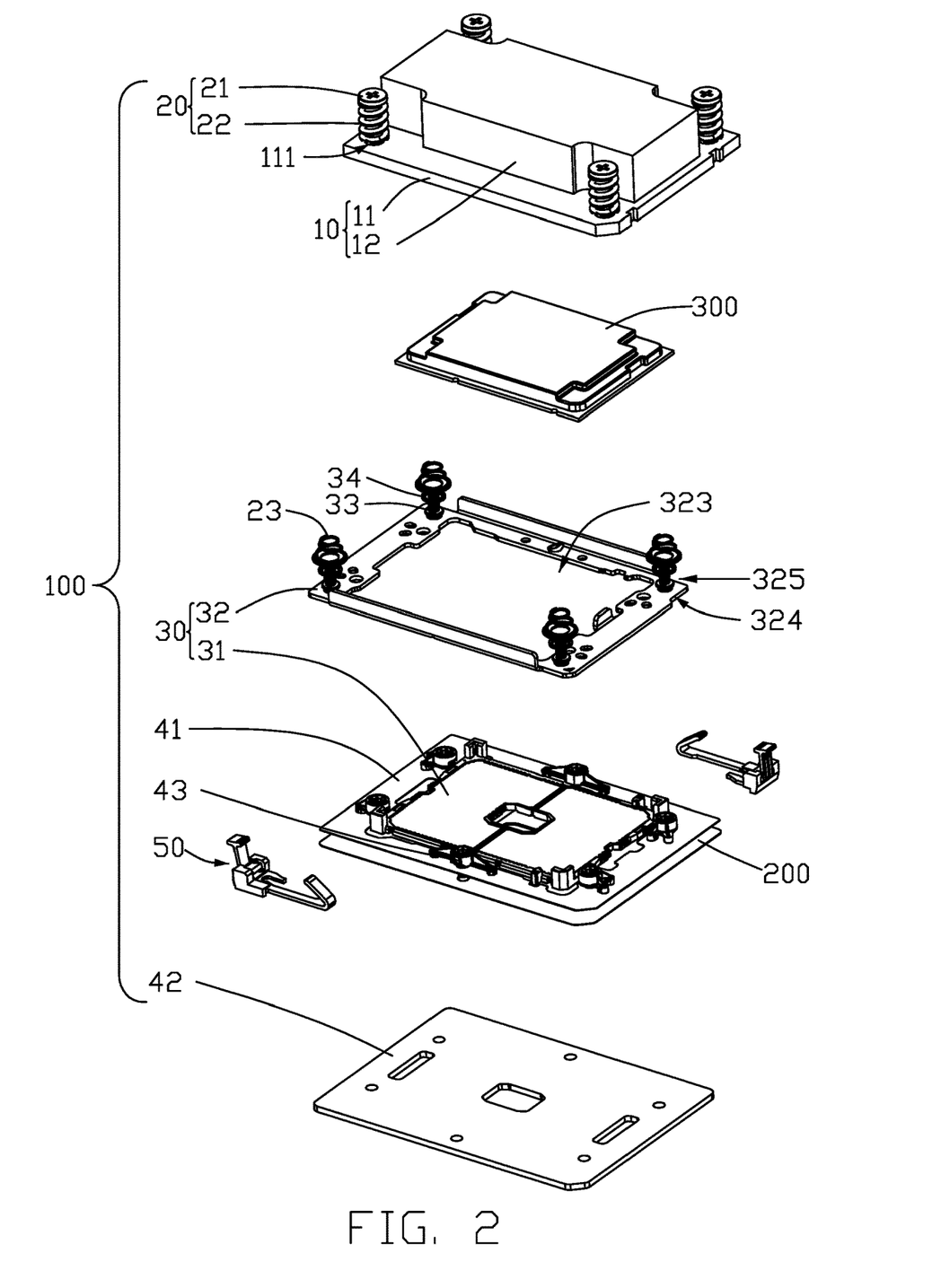
FIG. 2 is an exploded view of the electrical connector assembly.
Figure 3:
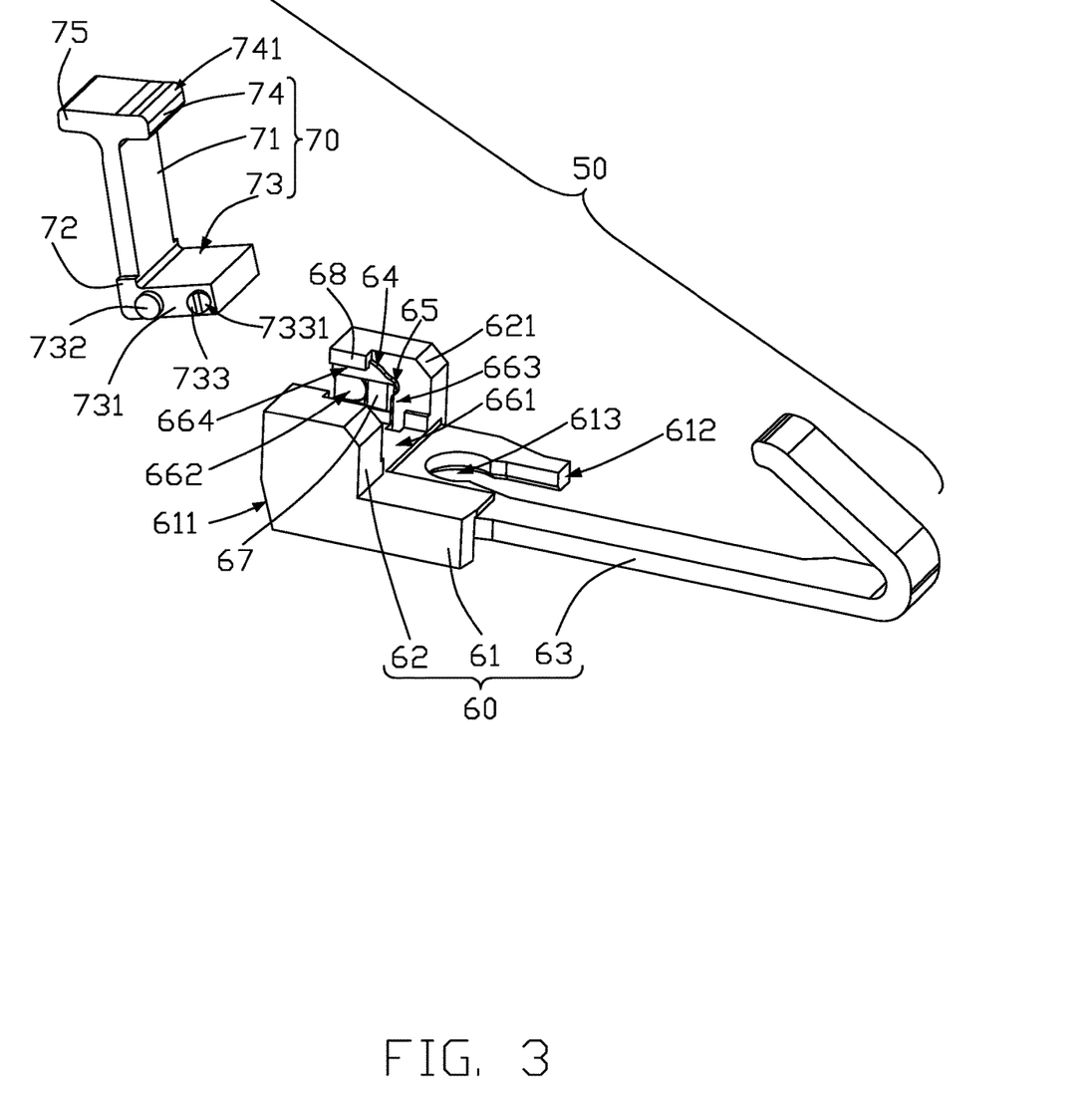
FIG. 3 is an exploded view of a retention member of the electrical connector assembly.
Figure 4:
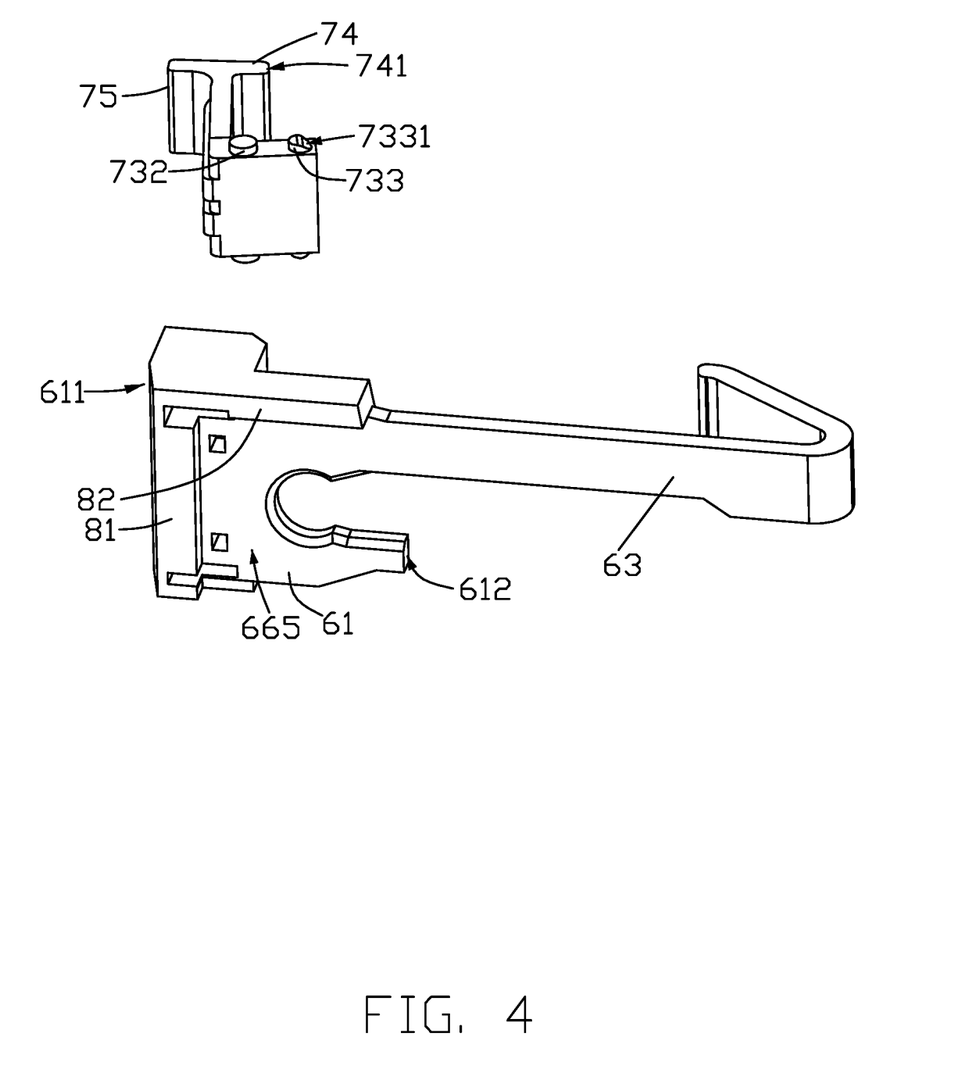
FIG. 4 is a view similar to FIG. 3 but from a different perspective.
Figure 5:
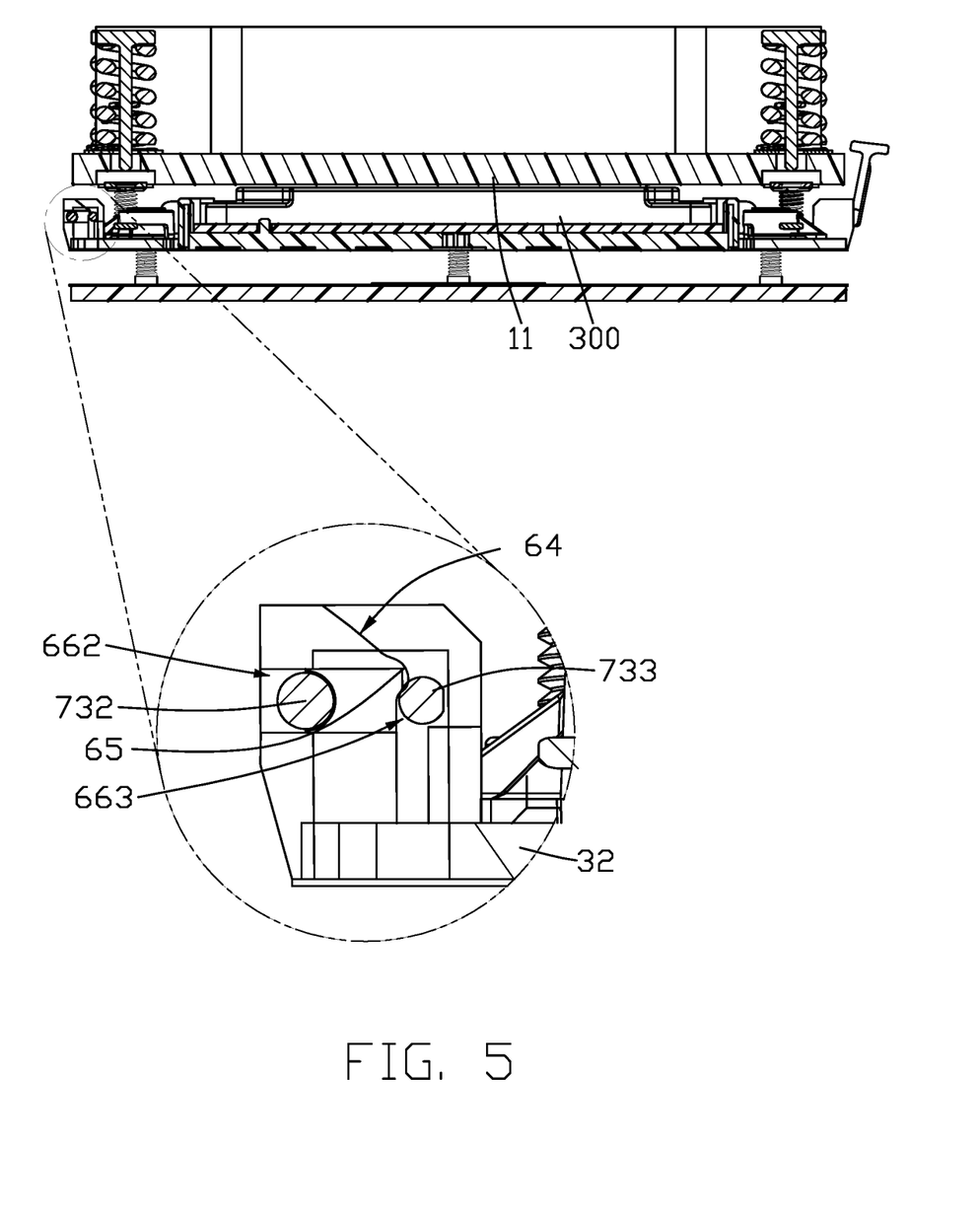
FIG. 5 is a cross-sectional view of the electrical connector assembly taken along line V-V in FIG. 1.
Figure 6:
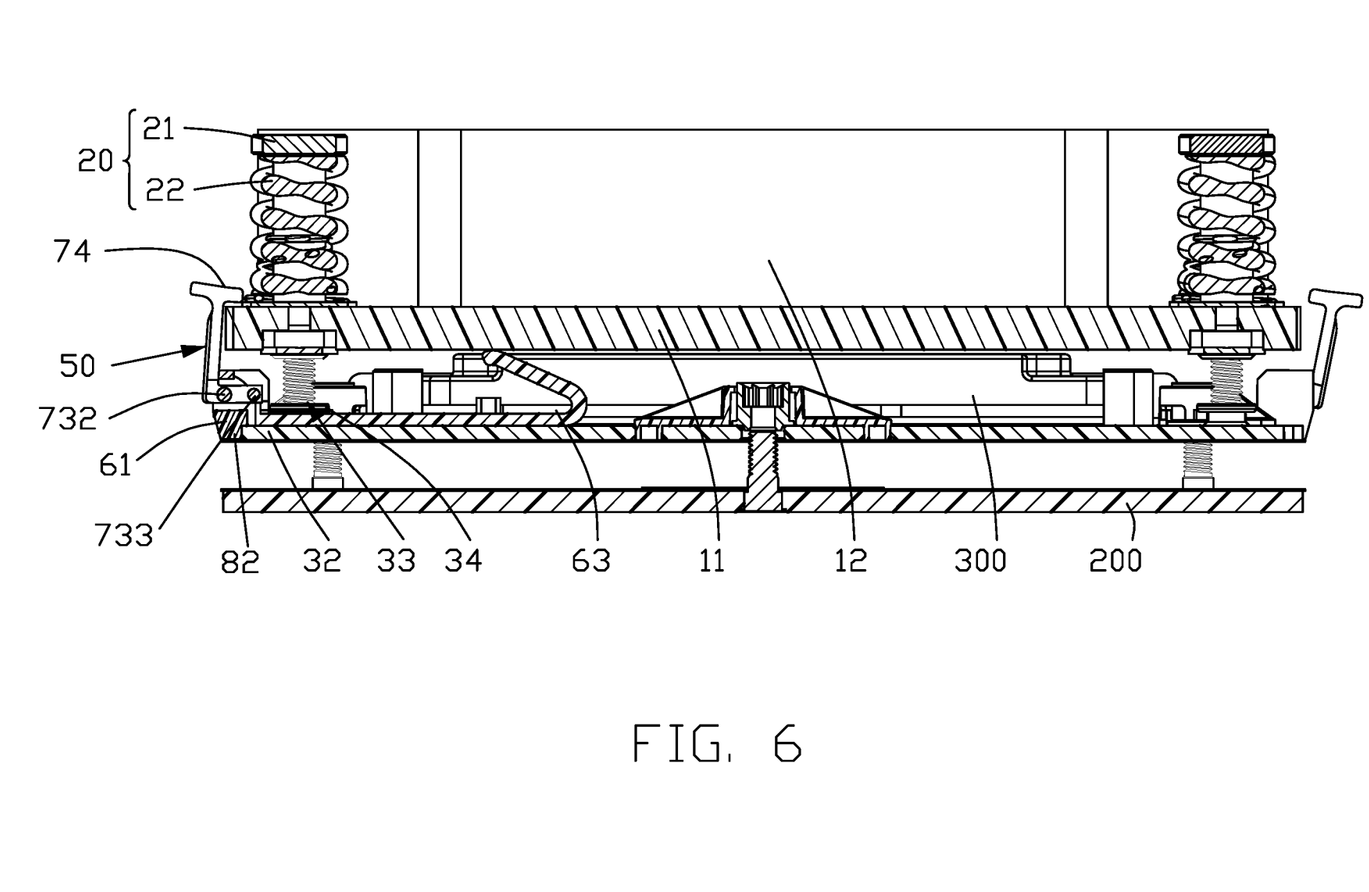
FIG. 6 is a cross-sectional view of the electrical connector assembly taken along line VI-VI in FIG. 1.
Figure 7:
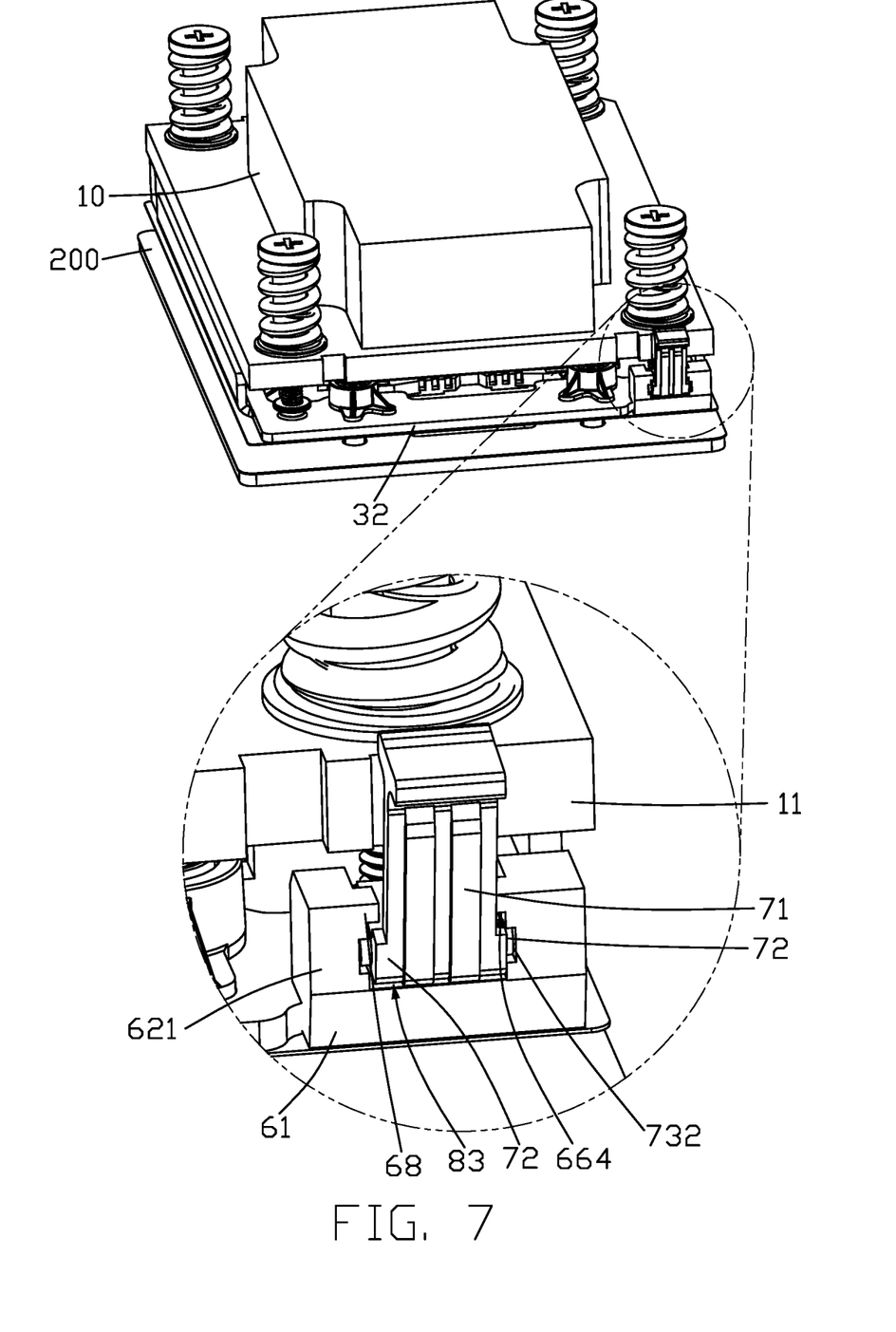
FIG. 7 is a view similar to FIG. 1 but from a different perspective.

The retention member 50 includes a mounting part 60 and a latching part 70 pivoted to the mounting part 60. The mounting part 60 has a mounting section 61 retained to the securing post 33, a tower 62, and an arm 63. The mounting section 61 has a first end 611, a second end 612, and a notch 213. The mounting section 61 may further have a first platform 81 and a second platform 82 at a bottom thereof corresponding to the first notch 324 and the second notch 325. The tower 62 has a pair of walls 621 spaced by a first slot 661. Each wall 621 has a ramp 64, a ratchet 65, and a stop 68. Each wall 621 further has a second slot 662 opening to an outer side, a third slot 663 under the ratchet 65, a guiding portion 67 between the second slot 662 and the third slot 663, and a fourth slot 664 under the stop 68. The latching part 70 has a coupling section 73, an engaging portion 74, and a connecting portion 71. The coupling section 73 has a body 731, a pair of pivots 732, and a pair of protrusions 733. Each protrusion 733 has a chamfer 7331. The engaging portion 74 has a latching portion 741 and an operating portion 75. The latching part 70 is pivotally assembled to the mounting part 60 by way of the pair of pivots 732 being received in the second slots 662. The latching part 70 is pivotable relative to the mounting part 60 to be at a locked position where the pair of protrusions 733 are locked by the pair of ratchets 65 in the third slots 663.

Figure 8:
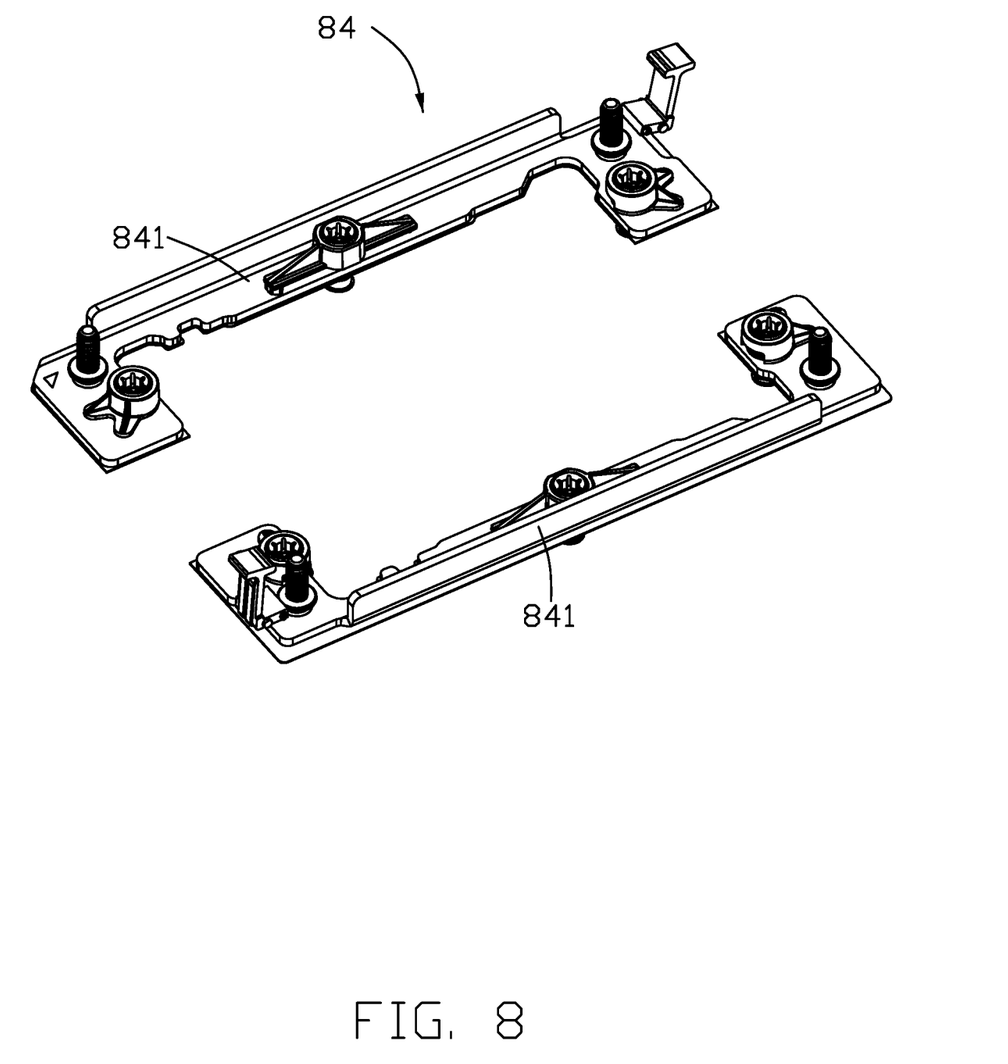
FIG. 8 is a perspective view of a securing seat of the electrical connector assembly according to a varied design.

FIG. 8 shows a securing seat 84 of a varied design, namely, in two pieces 841 instead of a one-piece securing seat 32.

The invention claimed is:

1. An electrical connector assembly comprising:
a printed circuit board;
an electrical connector seated upon the printed circuit board;
an electronic package coupled to the electrical connector;
a frame structure affixed to the printed circuit board;
a metallic securing seat affixed to the frame structure and having a plurality of securing posts;
a heat sink positioned upon the electronic package and having a plurality of through holes aligned with the plurality of securing posts;
a plurality of fasteners each extending through a corresponding through hole to engage a corresponding securing post and a plurality of springs each compressed between an associated fastener and the heat sink; and
a retention member mounted to a corresponding securing post for engaging the heat sink; wherein
the retention member has a mounting part and a latching part pivoted to the mounting part, and the mounting part is seated upon the metallic securing seat and located between the heat sink and the metallic securing seat.

2. The electrical connector assembly as claimed in claim 1, wherein the latching part has a pair of protrusions and the mounting part has a slot to receive the pair of protrusions and a pair of ratchets to lock the pair of protrusions in the slot.

3. The electrical connector assembly as claimed in claim 1, further comprising another retention member mounted to an opposite securing post.

* * * * *